US009760071B2

United States Patent
Bhattacharyya et al.

(10) Patent No.: US 9,760,071 B2
(45) Date of Patent: Sep. 12, 2017

(54) PROFILE BASED FAN CONTROL FOR AN UNMANAGEABLE COMPONENT IN A COMPUTING SYSTEM

(71) Applicant: Cisco Technology, Inc., San Jose, CA (US)

(72) Inventors: Sayantan Bhattacharyya, Kolkata (IN); Chitkala Sethuraman, Bangalore (IN); Clive Jeffrey Hall, Milpitas, CA (US)

(73) Assignee: Cisco Technology, Inc., San Jose, CA (US)

( * ) Notice: Subject to any disclaimer, the term of this patent is extended or adjusted under 35 U.S.C. 154(b) by 340 days.

(21) Appl. No.: 14/560,916

(22) Filed: Dec. 4, 2014

(65) Prior Publication Data
US 2016/0050789 A1    Feb. 18, 2016

(30) Foreign Application Priority Data
Aug. 18, 2014 (IN) .......................... 2333/DEL/2014

(51) Int. Cl.
*G05B 15/02* (2006.01)
*H05K 7/20* (2006.01)

(52) U.S. Cl.
CPC .......... *G05B 15/02* (2013.01); *H05K 7/20736* (2013.01); *H05K 7/20836* (2013.01)

(58) Field of Classification Search
CPC ....... G06F 1/206; G06F 1/3206; G05B 15/02; H05K 7/20209; H05K 7/20736; H05K 7/20836
USPC .......................................... 713/320; 700/300
See application file for complete search history.

(56) References Cited

U.S. PATENT DOCUMENTS

| | | | | |
|---|---|---|---|---|
| 7,426,109 | B2 * | 9/2008 | Lindell | H05K 7/20836 361/679.48 |
| 7,987,024 | B2 * | 7/2011 | Tunks | G06F 1/206 318/634 |
| 8,082,069 | B2 * | 12/2011 | Koshiyama | G05D 23/1931 165/287 |
| 8,704,477 | B2 | 4/2014 | Brown | |

(Continued)

OTHER PUBLICATIONS

Release Notes for Cisco UCS C-Series Software, Release 1.5(3g), CISCO, Jul. 22, 2014, Cisco Systems, Inc., San Jose, United States, <http://www.cisco.com/c/en/us/td/docs/unified_computing/ucs/release/notes/OL-28995-01.pdf>.

(Continued)

*Primary Examiner* — Chun Cao
(74) *Attorney, Agent, or Firm* — Patterson + Sheridan, LLP

(57) ABSTRACT

An unmanageable component may be any component in a computing system that does not expose a temperature sensor thereby preventing the component's temperature from being monitored. The embodiments described herein control a fan using settings that decrease the likelihood that an unmanageable component will overheat. Before a user-selected fan profile is used to control the fan, a power system management uses safeguarding profiles to mitigate the risk of overheating the unmanageable components in the computing system when selecting a fan profile. Stated differently, the power management system ensures the computing system does not use the user-selected profile to operate a fan if that profile may cause an unmanageable component to overheat.

20 Claims, 4 Drawing Sheets

(56) References Cited

U.S. PATENT DOCUMENTS

| | | | |
|---|---|---|---|
| 2003/0011984 A1* | 1/2003 | Chu | G06F 1/206 |
| | | | 361/679.48 |
| 2007/0162160 A1 | 7/2007 | Chang et al. | |
| 2008/0278905 A1* | 11/2008 | Artman | G06F 1/206 |
| | | | 361/679.31 |
| 2012/0215359 A1 | 8/2012 | Michael et al. | |
| 2013/0176680 A1* | 7/2013 | Lovicott | G06F 1/206 |
| | | | 361/679.48 |
| 2014/0032011 A1* | 1/2014 | Artman | G05D 23/1932 |
| | | | 700/300 |
| 2014/0117908 A1* | 5/2014 | Busch | G06F 1/206 |
| | | | 318/471 |
| 2014/0255146 A1 | 9/2014 | Kangas et al. | |
| 2014/0277750 A1* | 9/2014 | Artman | G05B 15/02 |
| | | | 700/275 |

OTHER PUBLICATIONS

Download Software, CISCO, Cisco Systems, Inc., San Jose, United States, <https://software.cisco.com/download/release.html?mdfid=284444319&flowid=33923&softwareid=283850974&release=1.5%25282%2529>.

\* cited by examiner

| PROFILE NAME | PROFILE NUMBER / WEIGHTAGE | DC-MIN | DC-MAX |
|---|---|---|---|
| PROFILE_LOW_POWER | 10 | 20 | 90 |
| PROFILE_BALANCED | 20 | 30 | 90 |
| PROFILE_PERFORMANCE | 30 | 35 | 90 |
| PROFILE_PCIe_CARD A | 35 | 40 | 90 |
| PROFILE_PCIe_CARD B | 36 | 45 | 90 |
| PROFILE_HIGH_POWER | 40 | 50 | 100 |
| PROFILE_PCIe_CARD C | 49 | 65 | 100 |
| PROFILE_MAX_POWER | 50 | 70 | 100 |

FIG. 3

PROFILE BASED FAN CONTROL FOR AN UNMANAGEABLE COMPONENT IN A COMPUTING SYSTEM

CROSS-REFERENCE TO RELATED APPLICATIONS

This application claims priority to Indian provisional patent application 2333/DEL/2014, filed Aug. 18, 2014. The aforementioned patent application is herein incorporated by reference in its entirety.

TECHNICAL FIELD

Embodiments presented in this disclosure generally relate to controlling a fan in a computing device. More specifically, embodiments disclosed herein perform a checking process to safeguard fan operation.

BACKGROUND

Fan control on rack servers is an important part of system management. Typically, the primary goal of fan control is to adequately cool the chassis. A secondary goal is to minimize the fan speeds in order to reduce power consumption and noise. While providing adequate cooling is still paramount, power and performance have increased in importance.

Many existing fan control algorithms on rack servers run the fans at a minimal speed which is determined by the ambient temperature (i.e., the temperature in a chassis containing the computing system). When any component exceeds its target temperature, the fans will be sped up until that component cools below its target temperature. To keep fan speeds low, the target temperatures are usually set to high values.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 3 is a table of fan profiles, according to one embodiment described herein.

To facilitate understanding, identical reference numerals have been used, where possible, to designate identical elements that are common to the figures. It is contemplated that elements disclosed in one embodiment may be beneficially utilized on other embodiments without specific recitation.

DESCRIPTION OF EXAMPLE EMBODIMENTS

Overview

Figure 1:
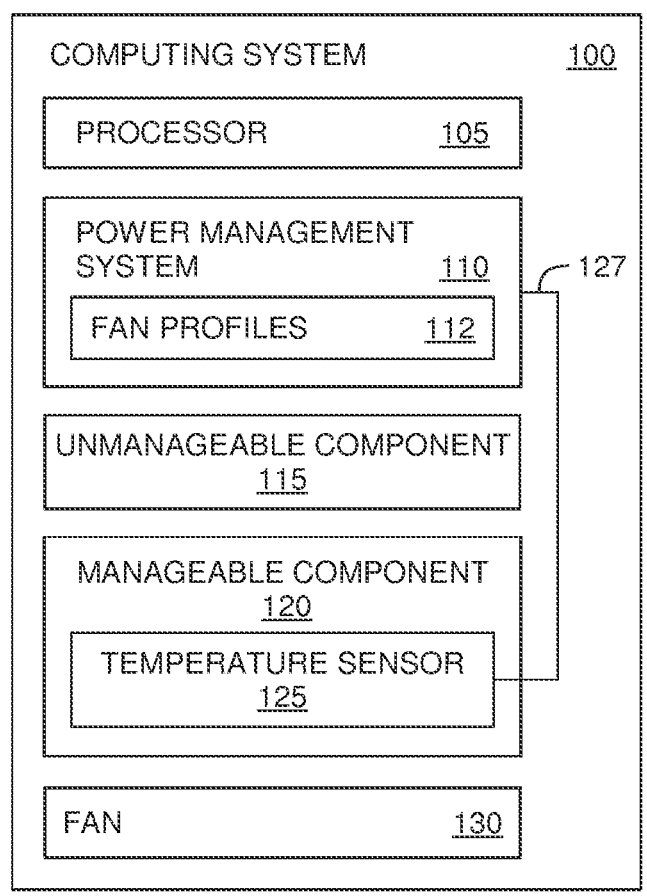
FIG. 1 is a computing system that includes an unmanageable component cooled by one or more fans, according to one embodiment described herein.

Embodiment presented in this disclosure include is a method and computer program product that include identifying an unmanageable component in a computing system where a temperature of the unmanageable component is unknown to the computing system. The method and computer program product include identifying a component specific profile corresponding to the unmanageable component, the component specific profile defining a first fan setting for cooling the unmanageable component and determining whether a second fan setting of a user-selected profile can adequately cool the unmanageable component based on the first and second fan settings. Upon determining the user-selected profile cannot adequately cool the unmanageable component, the method and computer program product include controlling a fan in the computing system based on the component specific profile instead of the user-selected profile.

Another embodiment of the present disclosure is a computing system that includes a fan for cooling an unmanageable component in the computing system, where a temperature of the unmanageable component is unknown to the computing system. The computing system also includes a power management system configured to identify a component specific profile corresponding to the unmanageable component, the component specific profile defining a first fan setting for cooling the unmanageable component, and determine whether a second fan setting of a user-selected profile can adequately cool the unmanageable component based on the first and second fan settings. Upon determining the user-selected profile cannot adequately cool the unmanageable component, the power management system is configured to control the fan based on the component specific profile instead of the user-selected profile.

Example Embodiments

While increasing fan speed whenever a component exceeds a target temperature is one technique for cooling a system, there are many situations where this control algorithm is inadequate. For example, a user may want maximum CPU performance which, for some modern CPUs, may mean the CPUs need to be cooled substantially below their maximum operating temperatures. Doing so requires higher fan speeds, which in turn, results in higher power consumption and noise levels, which may be undesirable to many users. In another example, a user may want to achieve the lowest power consumption by running the fans as slowly as possible, even stopping the fans if permitted. However, the slower the fans are run, the greater the risk of a component in the computing device overheating. To avoid overheating a component, the computing system may run the fans at speeds slightly faster than the lowest possible speed.

In one embodiment, the computing system includes an unmanageable component which may be any component that does not expose a temperature sensor thereby preventing the component's temperature from being monitored. For example, the unmanageable component may not contain a temperature sensor for reporting the temperature of the component to a power management system in the computing system. As a result, because the power management system is unaware of its temperature, the fan speed may be set at a speed that causes the unmanageable component to overheat. Non-limiting examples of unmanageable components include user-swappable components or adapters such as PCIe cards, hard disk drives, and the like. Any number of different types of known or unknown adapters (e.g., unmanageable components) can potentially be installed into a chassis. The power system manager may be unable to monitor the temperature on all of them, nor know how much cooling each type of adapter needs.

Embodiments herein allow a user to select from a plurality of predefined fan profiles that change the behavior of power management system to address the cooling needs of the computing system. For example, the user may select a high power fan profile in order to achieve maximum CPU performance or a low power fan profile to minimize power consumption. In the embodiments that follow, there are assumed to be five user selectable fan profiles—balanced, performance, low power, high power and maximum power—although there can be less or more than these profiles. In addition, the power system management includes safeguarding profiles to mitigate the risk of overheating unmanageable components in the computing system when selecting a fan profile. Stated differently, the power management system ensures the computing system does not use the user-selected profile to operate a fan if that profile may cause an unmanageable component to overheat.

FIG. 1 is a computing system 100 that includes an unmanageable component 115 cooled by one or more fans 130, according to one embodiment described herein. The computing system 100 includes a processor 105, power management system 110, unmanageable component 115, manageable component 120, and fan 130. Processor 105 (e.g., CPU) represents a single processor or multiple processors that each may include one or more processing cores. The power management system 110 may include control logic for managing the fans 130 in the computing system 100. To do so, power management system 110 includes different fan profiles 112 that may be used to operate the fan 130. As mentioned above, these fan profiles 112 may include the five user-selectable fan profiles of balanced, performance, low power, high power and maximum power.

In one embodiment, the balanced profile is predetermined to adequately cool the computing system 100 if no special system configuration exists. Non-limiting examples of a special system configuration are when an unmanageable component is present in the system or if an unknown component (e.g., a component not found in a support matrix) is present in the system. In one embodiment, a special system configuration may be any condition where the power management system 110 determines that the user-selected profile is inadequate to cool one or more components in the system. Baseline fan speeds are minimized, without being extreme. That is, the power management system 110 controls the fan speed to keep the fan speed as slow as possible without causing the temperature in the computing system 100 to rise above a predetermined value. Moreover, the balanced profile allows the temperature of the processor 105 to reach, or almost reach, its maximum designed temperature before the fan speed is increased.

In one embodiment, the performance profile is predetermined to maximize computation performance. In one example, when executing the performance profile, the power management system 110 behaves like it is executing the balanced profile except fan 130 runs at the same or higher speeds. As such, the performance profile may cool the processor 105 (and other components) more than balanced profile. Because the processor 105 may execute instructions faster at cooler temperatures, the performance profile may result in increased performance relative to the balanced profile.

In one embodiment, the low power profile is used when running power/performance benchmarks or computing systems that do not contain any components whose temperatures cannot be monitored by the power management system 110 (i.e., unmanageable components 115). This profile may behave the same as the balanced profile except (i) at low ambient temperatures in the computing system 100 the fans run as slowly as possible, even potentially stopping completely (ii) this profile may cool the processor 105 more when the processor 105 is under heavy load (e.g., executing a higher than normal number of instructions) if needed to optimize power and increase performance results, and (iii) this profile allows idle processors 105 to reach a higher temperature before beginning to increase the speed of fan 130.

In one embodiment, the high power profile is optimized for computing systems 100 that require higher minimum fan speeds. The behavior of this profile may be the same as the balanced profile except that the minimum fan speeds are higher. The minimum fan speeds for the high power profile may vary according the specific computing platform. In one example, the fan speeds are anticipated to be 70-85% of the maximum fan speed.

In one embodiment, the maximum power profile is optimized for systems that require minimum fans speeds than are greater than the minimum fan speeds of the high power profile. Behavior of the maximum power profile may be the same as the balanced profile, except that the minimum fan speeds are higher than the minimum fan speeds of the high power profile. The new minimum fan speeds may vary per platform but, in one example, may be 85-100% of the maximum fan speed. Furthermore, duty cycle values used to operate the fan 130 in these five example fan profiles 112 may vary between computing systems because different systems come with different chassis design and hence different air flow patterns.

The computing system 100 may include one or more I/O devices (not shown) such as a monitor, keyboard, mouse, touch pad, and the like which the computing system 100 uses to receive a user selection of one of the fan profiles 112. The user selected fan profile may be one input parameter (but not necessarily the exclusive input parameter) used by the power management system 110 to determine the final duty cycle of the fan 130. To safeguard the system from overheating, the control logic in the power management system 110 evaluates the different computing components/adapters in the computing system to determine if the user selected fan profile is adequate to avoid overheating any of the components. For example, the unmanageable component 115 does not have a temperature sensor that directly measures the temperature of the component 115. Instead, the computing system 100 may rely on temperature sensors that measure the ambient temperature within a chassis containing the computing system 100 to estimate the temperature of component 115. Alternatively, the unmanageable component 115 may have a temperature sensor located on the component 115 which directly measures its temperature, but the temperature may not be reported out to any other module, component, or system in the computing system 100. For example, the unmanageable component 115 may use the measured temperature for its own internal purposes but does not include means for transmitting the temperature to the power management system 110, for example.

However, for various reasons, the ambient temperature may be a poor representation of the temperature of the unmanageable component 115. For instance, by the time the ambient temperature indicates to the power management system 110 that the unmanageable component 115 is overheating, the component 115 may have already failed. Thus, the power management system 110 may operate the fan 130 in a manner to ensure that the unmanageable components 115 do not overheat. For example, even if the ambient temperature in the chassis of the computing system 100 indicates that the fan 130 could be shut off, the power management system 110 may nonetheless operate the fan 130 at 15% of its maximum speed to ensure the unmanageable components 115 in the system 100 do not overheat. Thus, not being able to directly measure the temperature of the unmanageable component 115 may cause the computing system 100 to waste power in situations where the unmanageable component 115 would not overheat if the fan speed were reduced.

The manageable component 120 includes a temperature sensor 125 communicatively coupled to the power management system 110 via a communication path 127. The temperatures sensor 125 directly measures the temperature of the manageable component 120 (e.g., a temperature sensor on a motherboard, processor, PCIe card, and the like). In one embodiment, the power management system 110 ignores the manageable component 120 when ensuring that the user selected fan profile 112 will not cause the computing system 100 to overheat because the power management system 110 can directly monitor the temperature on the manageable component 120 using sensor 125, and thus, increase the speed of the fan 130 if the component 120 begins to overheat. Stated differently, unlike in the case of the unmanageable component 115 which may overheat before the power management system 110 can increase the fan speed, the power management system 110 can monitor the temperature of the manageable component 120 directly and increase the fan speed before this component overheats. In contrast, the power management system 110 may not be able to increase the fan speed in time to prevent the unmanageable component 115 from overheating and failing. Thus, the power management system 110 may perform a safeguarding technique to mitigate the risk that the fan profile 112 selected to operate the fan 130 will cause the unmanageable component 115 to overheat.

The computing system 100 may include any number of fans 130. The fans 130 may be attached to different areas of the chassis or located at a shared fan interface. Moreover, one or more of the fans 130 may be directly mounted on a component in the computing system 100. For example, a fan may be mounted on the processor 105 or a motherboard.

The power management system 110 may be hardware, software, or some mixture of both. Although as shown being located within computing system 100, in one embodiment, the power management system 110 is external to the computing system 100. For example, the power management system 110 may control the fans in multiple different computing systems (e.g., multiple blade servers) on one or more racks. In this case, the power management system 110 may be in only one of blade servers or may be placed in a separate computing system that monitors the different functions of the servers.

Figure 2:
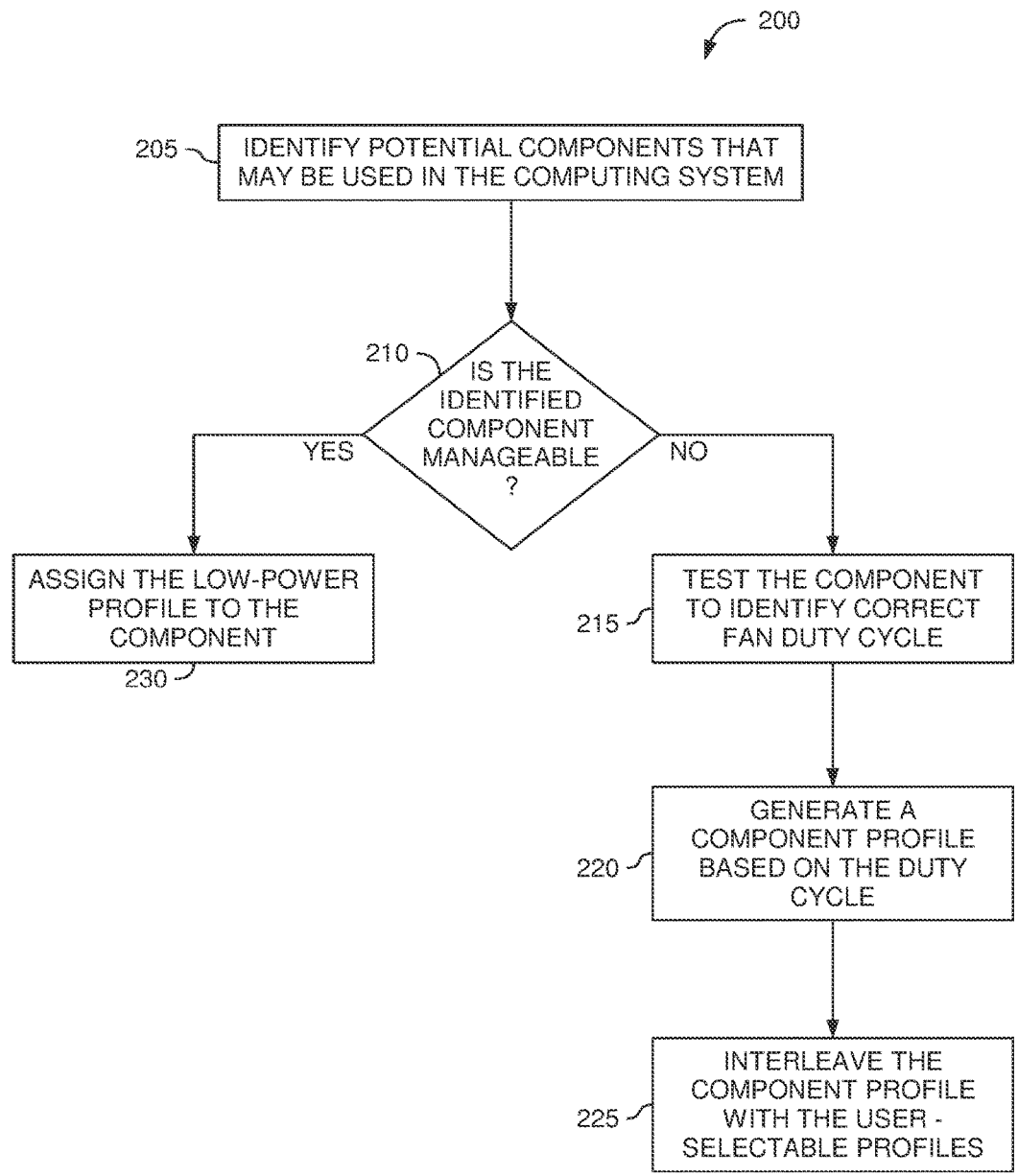
FIG. 2 is a flow chart for generating component profiles for fan control, according to one embodiment described herein.

FIG. 2 is a flow chart 200 for generating component profiles for fan control, according to one embodiment described herein. Although the following describe generating component specific profiles for different PCIe cards, this disclosure is not limited to such. For example, a testing system may be used to generate a component profile for any unmanageable component (e.g., storage, adapter, motherboard, or other user-swappable component). At block 205, potential components that may be used in the computing system are identified. As part of this block, an inventory of all the PCIe cards present in a support matrix is identified and the thermal nature/cooling needs of the PCIe cards are defined. For example, the support matrix may include a list of all PCIe cards the manufacturer of the computing system 100 in FIG. 1 wishes to support. The support matrix can include PCIe cards that are both manageable (i.e., the temperature of the cards can be directly measured) and unmanageable (i.e., the temperature cannot be directly measured).

To configure the computing system 100 to support the unmanageable PCIe cards, the manufacturer uses method 200 to generate component profiles for each of the cards. As will be described in detail below, once the component profiles for the PCIe cards are generated, the manufacturer can inform the purchaser of the computing system 100 which PCIe cards are supported and those that are not. Stated differently, the manufacturer can provide the purchaser with the support matrix so that the purchaser can identify the PCIe cards that are compatible with the computing system 100.

One example of an entry in the inventory is a PCI four Part ID which identifies a vendor ID, Device ID, sub-vendor ID, and sub-device ID. The entry may also include a card manageability value that states whether the card temperature can be read or monitored. This field may be set to ZERO for where the temperature cannot be directly measured (i.e., the PCIe card is unmanageable). For cards from which the temperature can be read, the card manageability field is set to a value of ONE. The entry may also include a card profile that defines the lowest possible fan profile (or duty cycle in generic terms) with which this card can survive (i.e., continue to function) if this is the only card present in the system. Each PCIe card in the inventory may have its own entry.

At block 210, a technician or evaluation module determines whether the PCIe card is manageable—i.e., whether the value of the card manageability flag in the entry is a ONE or ZERO. If manageable, at block 230, the low power profile is assigned to the PCIe card. Stated broadly, the most power conservative fan profile (e.g., the low power profile) may be assigned to the manageable PCIe cards. Doing so means that the manageable PCIe card is compatible with the most power conservative fan profile, and thus, the power management system is permitted use this profile to control the fan when the PCIe card is installed in the system. Even if the most power conservative fan profile is inadequate to cool the PCIe card, because the card is manageable and its temperature can be directly measured, the power management system can increase the fan speed if the PCIe card begins to overheat.

If the PCIe card is not manageable, at block 215, the card is tested to identify the correct fan duty cycle. Many cards listed in the support matrix may produce a lot of heat but the card temperature cannot be directly monitored—e.g., LSI985/86, LSI Nytro™ (Nytro is a trademark of LSI Corporation in the US and other jurisdictions) and PCIe Flash using VIRIDENT™ (VIRIDENT is a trademark of HGST, Inc. in the US and other jurisdictions). The temperature of these cards cannot be directly monitored (i.e., the cards are unmanageable) and hence even if these cards are producing a large amount of heat, the power management system cannot react instantly. In one embodiment, it is impractical to wait until the ambient temperature increases in that a particular zone of a chassis before increasing the fan speed. That is, if the system waits for the heat produced by the PCIe card to change the temperature measured by a temperature sensor in the computing system that is not mounted on the card, the PCIe card may have already failed. The chassis of a computing system may be divided into different zones where each zone includes one or more temperature sensors. The power management system may use the temperatures detected by the sensors to, for example, increase the fan speed set by the current fan profile in order to ensure the components in a particular zone do not overheat. However, by that time the power management system responds to an increase in temperature in a particular zone, the card might have already been shut down or failed.

Instead of relying on indirectly measuring the temperature of the unmanageable cards, card specific profiles (also referred to herein as "component specific profiles" or "component profiles") are generated which define a fixed duty cycle of the fan or fans. The technician or evaluation module tests an unmanageable PCIe card to identify the duty cycle settings that are sufficient to keep the card cool at different ambient temperature ranges under, for example, maximum stress scenario (e.g., maximum computational load) to get the maximum needed DC duty cycle for operating the fan. That is, for a plurality of different ambient temperatures, the technician may test the card to determine what fan duty cycle is needed to prevent the card from overheating or failing. Moreover, the duty cycle setting in the card specific profile may vary depending on the platform of the computing system since different platforms come with different chassis design and hence different air flow patterns. As such, the technician or evaluation module may identify different component specific profiles (and corresponding fan duty cycles) for each of the different platforms. Also note that in at least one embodiment, the card specific profiles are not selectable by the user and only the power management system can set or change these profiles.

As discussed in block 230, if the card is a manageable card, the card profile is set to the low power profile because the power system manger can read the card temperature and react to its change in time, so controlling the fan using the low power profile will not result in damage to the card. If the card is an unmanageable card, testing is performed at block 215 to find out the correct duty cycle for that card.

At block 220, the identified duty cycle is used to define the component profile. For example, after testing, a PCIe Card A Fan Profile setting may indicate that the card needs a minimum of 76% duty cycle even at the lowest ambient temperature on a particular computing system with a specific chassis. As discussed above, the component profile may record minimum duty cycles of the card which correspond to the maximum possible duty cycle of the fan that the card might need at different ambient temperatures under full stress. These minimum fan duty cycles may then be collected to form the component profile for the card—e.g., PROFILE_PCIe_CARD_A. Each card may also have other component profiles that correspond to different computing systems platforms (e.g., different chassis configurations).

In one embodiment, the power management system stores an exhaustive inventory of all the supported components on a motherboard for that particular computing system—e.g., a particular server model. The inventory entries include information detailing the cooling requirements (denoted by the component profile in the entry) of the supported components.

In one embodiment, the user-selectable profiles and component profiles corresponding to a particular computing system are each assigned a linear non-negative integer number (also referred to as Profile Number/Weightage). In one embodiment, before assigning the profile numbers, however, the profiles are sorted (at block 225) in ascending order with regards to cooling power (or duty cycle). As a result of the sorting, the component profiles may be interleaved with the user-selectable profiles to generate a ranking for the different profiles. A typical (hypothetical) example (containing only PCIe cards) is shown by table 300 of FIG. 3.

In FIG. 3, the user-selectable and component profiles are ranked using the DC-min and DC-max values which define the duty cycle of the fan for that profile. The DC value defines the duty cycle of the fan. The DC-min is a safeguarding factor which ensures the card will not overheat even under full stress for a particular ambient temperature (or range of temperatures). The DC-max may be set to a high value (e.g., 90-100%) to provide flexibility so that if the temperatures of manageable components begin to increase, the duty cycle of the fan can be increased to ensure these components do not overheat. The greater the DC value, the greater the fan duty cycle. Each profile includes a range of the DC values, and thus, a range of the fan duty cycle. For example, the DC-min for the PROFILE_LOW_POWER (a user-selectable fan profile) is a 20% duty cycle while the DC-max is a 90% duty cycle. As shown, the profile number the highest ranked profiles (i.e., the highest fan duty cycles) are at the bottom while the lowest ranked profiles (i.e., the lowest fan duty cycles) are at the top. The user-selectable profiles (i.e., the low power, balanced, performance, high-power, and max-power) are ranked against the card specific profiles generated by testing the components (in this case, PCIe cards) at block 220.

Once the profiles are ranked using the duty cycle, the profile number/weightages may be assigned. In this example, the highest ranked profile PROFILE_MAX_POWER) is assigned the largest profile number/weightage while the lowest ranked profile (i.e., PROFILE_LOW_POWER) is assigned the smallest profile number/weightage. The profiles are then assigned profile numbers such that the numbers decrease moving from the highest to the lowest ranked profiles. The profile numbers may be assigned ad hoc, linearly, exponentially, based on changes in the fan duty cycle relative to the other profiles, and the like. As a result of ranking the user-selectable and component profiles using the fan duty cycles, the profile numbers/weightages are abstract representations of the fan duty cycle value(s) of the profiles. Thus, the profile number/weightage provides an easy reference for comparing the user-selectable and component profiles. For example, because PROFILE_PCIe_CARD_C has a higher profile number than PROFILE_HIGH_POWER, the power management system can automatically determine that the fan duty cycle for the former is higher than the latter without having to look up and evaluate the DC-min and DC-max values corresponding to each profile. In one embodiment, however, the profile number/weightage values may be omitted and the power management system may rely directly on the DC-min and DC-max values to compare the profiles.

Moreover, the duty cycle measurements of table 300 may be taken at a particular ambient temperature or range of ambient temperatures—e.g., 0-15 degree C. The DC-min value typically increases as the ambient temperature increases but that may not always be the case. Accordingly, a component profile or user-selectable profile may include different duty cycle settings for each of the different ambient temperature ranges. For example, Table 1 illustrates how the duty cycle for the PROFILE_MAX_POWER changes according to different ambient temperature ranges.

TABLE 1

| Ambient Range (° C.) | DC-Min | DC-Max |
| --- | --- | --- |
| 0-30 | 70 | 100 |
| 30-35 | 75 | 100 |
| 35-40 | 80 | 100 |
| 40+ | 85 | 100 |

Figure 4:
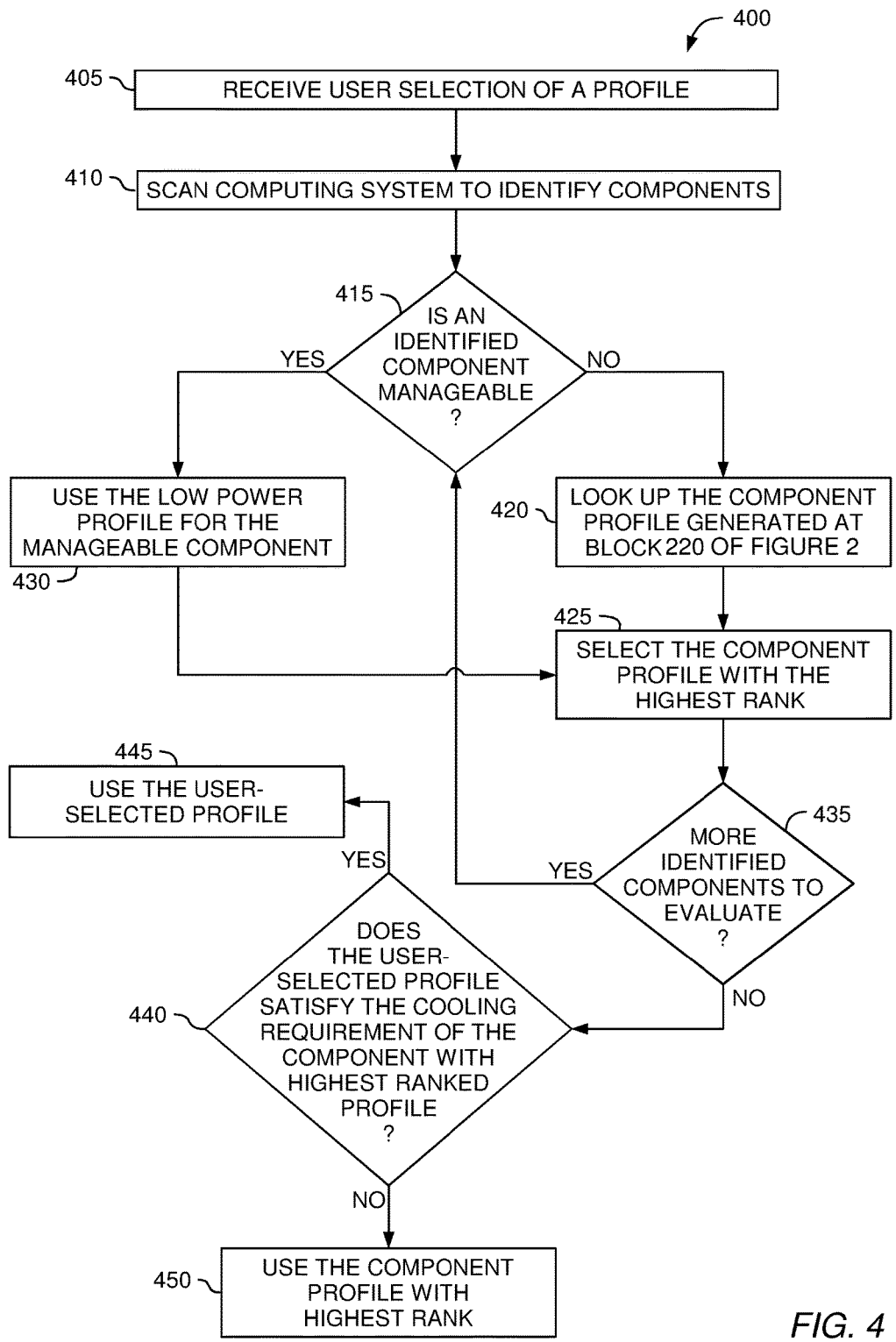
FIG. 4 is a flow chart for safeguarding a user-selected fan profile, according to one embodiment described herein.

FIG. 4 is a flow chart 400 for safeguarding a user-selected fan profile, according to one embodiment described herein.

In one embodiment, method 400 begins when a fan control algorithm in the power management system is first started, or if a user selects a user-selectable profile while the fan control algorithm is already executing. At block 405, the power management system receives a selection from a user for one of the five user-selectable profiles. User selection of a profile can be made, for example, from a dropdown menu of a graphical user interface using an I/O device coupled to the computing system. At block 410, the power management system scans the computing system to identify or discover the components plugged in or installed on the system. Furthermore, the power management system searches the inventory described above to determine if the identified component is included within the inventory.

At block 415, the power management system determines if a component discovered during the scan is manageable. To do so, the power management system may check the manageability flag stored in the entry corresponding to the component in the inventory. If manageable, at block 430, the rank of the low power profile is assigned to the component. Stated broadly, the most power conservative fan profile (e.g., the low power profile) may be assigned to the manageable components. As described above, even if the most power conservative fan profile is inadequate for cooling the manageable component, the power management profile can monitor the temperature of the component and increase the fan settings in the profile if the component begins to overheat.

Alternatively, if the component is manageable and stored in the inventory, the low power profile may have been assigned previously to the manageable component. In such a case, method 400 may be simplified so that the component profile specified in the inventor (e.g., the low power profile if the component is manageable or the customized profile if the component is unmanageable) is selected and compared to other profiles at block 425 rather than assigning the low power profile to the manageable components at block 430.

If the component is unmanageable, at block 420 the power management system looks up the component profile generated at block 220 of FIG. 2. For example, the power management system may parse into chart 300 shown in FIG. 3 to identify a profile corresponding to the unmanageable component. In one embodiment, every unmanageable component listed in the inventory has a corresponding component profile which the power management system is able to access.

At block 425, the power management system determines the component with the highest ranked profile (i.e., the highest profile number) amongst the components that have already been evaluated. For example, as the power management system evaluates each component identified at block 410, the system may maintain a register value of the component with the highest ranked component specific profile—i.e., the profile with the highest profile number/weightage.

If at block 435 there are more components that were discovered but for which the respective profile number has not yet been evaluated, the method 400 returns to block 415. However, if the component profiles for all the components identified at block 410 have been evaluated to identify the highest ranking profile, method 400 proceeds to block 440. Here, method 400 determines whether the user selected profile satisfies the cooling requirement of the component with the highest ranked profile. Stated differently, the power management system compares the profile number from the highest ranked profile of the identified components to the profile number of the user selected profile. The power management system selects the highest of the two profile numbers (i.e., the highest ranked profile) and applies that corresponding fan profile in the system.

If the user-selected profile is predicted to adequately cool the highest ranked component (i.e., the user-selected profile has a higher profile number than the component specific profile), at block 445, the power management system selects the user-selected profile and executes the fan control algorithm using the fan duty cycle range established in the profile. However, if the user-selected profile is predicted to not adequately cool the component with the highest profile number (i.e., the user-selected profile has a lower profile number than the component profile), at block 450, the power management system selects the component specific profile of the component and executes the fan control algorithm using the fan duty cycle range established in that profile.

Using the profiles illustrated in FIG. 3 as an example, assume the highest ranked profile for the components identified using method 400 was PROFILE_PCIe_CARD_B which has a profile number of 36. If the user selects the high power profile, because the PROFILE_HIGH_POWER has a higher profile number than PROFILE_PCIe_CARD_B, the power management system uses the duty cycle settings in the high power profile to execute the fan control algorithm since these settings satisfy the cooling needs of PCIe card B. In contrast, if the user selected the performance fan profile, the power management system instead uses the setting in the PROFILE_PCIe_CARD_B rather than the settings of PROFILE_PERFORMANCE since the duty cycle settings in the performance fan profile may not satisfy the cooling requirements of PCIe card B (which is indicated by the PCIe Card B profile having a higher profile number than the performance profile). In this manner, even if the user is unaware of the system configuration or the heat generated by the components present in the system and selects a random fan profile, method 400 still selects a suitable minimum fan duty cycle to prevent overheating of the unmanageable components. In one embodiment, instead of the using a profile number or weightage to compare the user-selected and component profiles, the power management system may compare the fan duty cycle settings in order to ensure the user-selected profile can adequately cool the components in the computing system.

In a further example, if the user chooses the balanced power profile and an unknown, unmanageable PCIe card is installed into the system (i.e., a component for which there is no generated component profile stored in the inventory described above), the power management system may apply a SAFE duty cycle (defined to be safe for any unknown card) which is appropriate for the unknown card. In one example, the safe duty cycle may be achieved by setting the fan profile of the system to the max power profile.

In one embodiment, the present disclosure enables users to modify fan control behavior through selection of fan profiles, to facilitate optimal behavior in targeted use cases such as maximum performance and low power. Fan control may be further optimized by utilizing the research/testing done on the thermal behavior of potential components that may be used in the computing system to identify the behavior of the components that do not expose component temperature. The power management system identifies whether the user selected fan profile is likely to provide insufficient cooling, and if so, increase the fan setting in the currently selected profile. Doing so may improve reliability.

Furthermore, the embodiments described herein enable users to modify fan control behavior to run the fans as per their needs while, at the same time, providing the necessary safeguards to not disrupt the thermal equilibrium of the system. For unmanageable components, this solution may rely on fixed duty cycle ranges rather than the component's temperature sensor input which may not be available. In one embodiment, the techniques described herein are not Basic Input/Output System (BIOS) based and are purely a Baseboard Management Controller (BMC) based solution which may be more powerful with respect to the management of the fans of the servers in the datacenters. Scriptable interfaces like CLI & XML API can configure fans of hundreds of servers simultaneously.

Moreover, the embodiments herein may enable the latest generation CPUs to run at their maximum performance levels in benchmark testing. Additionally, the embodiments herein may enable rack servers to use minimal amounts of fan power when possible, thereby resulting in optimal results in industry-standard power/performance benchmarks. Furthermore, the embodiments herein may improve the reliability of rack server products by improving fan control behavior such that it can prevent overheating in situations where, in the absence of these techniques described herein, the server would overheat.

In the preceding, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, the embodiments disclosed herein may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

Aspects of the present disclosure may be a system, a method, and/or a computer program product. The computer program product may include a computer readable storage medium (or media) having computer readable program instructions thereon for causing a processor to carry out aspects described herein.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described above with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality and operation of possible implementations of systems, methods and computer program products according to various embodiments. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In view of the foregoing, the scope of the present disclosure is determined by the claims that follow.

We claim:

1. A method comprising:
   identifying an unmanageable component in a computing system using one or more computer processors, wherein a temperature of the unmanageable component is unknown to the computing system;
   identifying a component specific profile corresponding to the unmanageable component, the component specific profile defining a first fan setting for cooling the unmanageable component;
   determining whether a second fan setting of a user-selected profile can adequately cool the unmanageable component based on the first and second fan settings; and
   upon determining the user-selected profile cannot adequately cool the unmanageable component, operating a fan in the computing system based on the component specific profile instead of the user-selected profile.

2. The method of claim 1, further comprises:
   identifying a plurality of unmanageable components in the computing system, each corresponding to a respective component profile and a respective fan setting; and
   identifying a highest ranked component profile based on the respective fan settings, wherein the component specific profile is the highest ranked component profile.

3. The method of claim 2, wherein the respective component profiles and the user-selected profile are assigned respective profile numbers based on the respective and second fan settings, the respective profile numbers ranking the respective component and user-selected profiles relative to each other,
   wherein determining whether the second fan setting of the user-selected profile can adequately cool the unmanageable component further comprises determining, using the respective profile numbers, whether the user-selected profile is ranked higher than the highest ranked component profile, the method further comprises:
   upon determining the user-selected profile is ranked higher than the highest ranked component profile, controlling the fan in the computing system based on the user-selected profile; and
   upon determining the user-selected profile is not ranked higher than the highest ranked component profile, controlling the fan in the computing system using the highest ranked component profile.

4. The method of claim 1, further comprising, upon determining the user-selected profile cannot adequately cool the unmanageable component, ignoring the user-selected profile and the second fan setting.

5. The method of claim 1, wherein the component specific profile is generated by testing the unmanageable component under maximum stress to identify the first fan setting which adequately cools the unmanageable component in the computing system for a given ambient temperature or temperature range, and
   wherein no temperature sensor directly contacts the unmanageable component in the computing system.

6. The method of claim 1, wherein the first and second fan settings define respective duty cycles of the fan in the computing system.

7. The method of claim 1, further comprising:
   discovering an unidentifiable component in the computing system, wherein the temperature of the unidentifiable component is unknown to the computing system and there is no component specific profile corresponding to the unidentifiable component; and
   controlling the fan using a safe power profile with a third fan setting adequate to cool any unidentifiable component.

8. A computer program product, comprising:
   computer-readable program code configured to when executed by one or more computer processors:
      identify an unmanageable component in a computing system, wherein a temperature of the unmanageable component is unknown to the computing system;
      identify a component specific profile corresponding to the unmanageable component, the component specific profile defining a first fan setting for cooling the unmanageable component;
      determine whether a second fan setting of a user-selected profile can adequately cool the unmanageable component based on the first and second fan settings; and
      upon determining the user-selected profile cannot adequately cool the unmanageable component, operate a fan in the computing system based on the component specific profile instead of the user-selected profile; and
   a non-transitory computer readable medium that stores the computer-readable program code.

9. The computer program product of claim 8, wherein the program code is configured to:
   identify a plurality of unmanageable components in the computing system, each corresponding to a respective component profile and a respective fan setting; and
   identify a highest ranked component profile based on the respective fan settings, wherein the component specific profile is the highest ranked component profile.

10. The computer program product of claim 9, wherein the respective component profiles and the user-selected profile are assigned respective profile numbers based on the respective and second fan settings, the respective profile numbers ranking the respective component and user-selected profiles relative to each other, wherein determining whether the second fan setting of the user-selected profile can adequately cool the unmanageable component further comprises determining, using the respective profile numbers, whether the user-selected profile is ranked higher than the highest ranked component profile wherein the program code is configured to:
upon determining the user-selected profile is ranked higher than the highest ranked component profile, control the fan based on the user-selected profile; and
upon determining the user-selected profile is not ranked higher than the highest ranked component profile, control the fan using the highest ranked component profile.

11. The computer program product of claim 8, wherein the program code is configured to, upon determining the user-selected profile cannot adequately cool the unmanageable component, ignore the user-selected profile and the second fan setting.

12. The computer program product of claim 8, wherein the component specific profile is generated by testing the unmanageable component under maximum stress to identify the first fan setting which adequately cools the unmanageable component in the computing system for a given ambient temperature or temperature range, and
wherein no temperature sensor directly contacts the unmanageable component in the computing system.

13. The computer program product of claim 8, wherein the first and second fan settings define respective duty cycles of the fan in the computing system.

14. The computer program product of claim 8, wherein the program code is configured to:
discover an unidentifiable component in the computing system, wherein the temperature of the unidentifiable component is unknown to the computing system and there is no component specific profile corresponding to the unidentifiable component; and
control the fan using a safe power profile with a fan setting adequate to cool any unidentifiable component.

15. A computing system, comprising:
a computer processor;
a fan for cooling an unmanageable component in the computing system, wherein a temperature of the unmanageable component is unknown to the computing system; and
a power management system configured to when executed by the computer processor:
identify a component specific profile corresponding to the unmanageable component, the component specific profile defining a first fan setting for cooling the unmanageable component;
determine whether a second fan setting of a user-selected profile can adequately cool the unmanageable component based on the first and second fan settings; and
upon determining the user-selected profile cannot adequately cool the unmanageable component, operate the fan based on the component specific profile instead of the user-selected profile.

16. The computing system of claim 15, further comprising:
a plurality of unmanageable components, each corresponding to a respective component profile and a respective fan setting, and
wherein the power management system is configured to identify a highest ranked component profile based on the respective fan settings, wherein the component specific profile is the highest ranked component profile.

17. The computing system of claim 16, wherein the respective component profiles and the user-selected profile are assigned respective profile numbers based on the respective and second fan settings, the respective profile numbers ranking the respective component and user-selected profiles relative to each other, wherein determining whether the second fan setting of the user-selected profile can adequately cool the unmanageable component further comprises determining, using the respective profile numbers, whether the user-selected profile is ranked higher than the highest ranked component profile, and
wherein the power management system is configured to:
upon determining the user-selected profile is ranked higher than the highest ranked component profile, control the fan based on the user-selected profile; and
upon determining the user-selected profile is not ranked higher than the highest ranked component profile, control the fan using the highest ranked component profile.

18. The computing system of claim 15, wherein the power management system is configured to, upon determining the user-selected profile cannot adequately cool the unmanageable component, ignore the user-selected profile and the second fan setting.

19. The computing system of claim 15, wherein the component specific profile is generated by testing the unmanageable component under maximum stress to identify the first fan setting which adequately cools the unmanageable component in the computing system for a given ambient temperature or temperature range, and
wherein no temperature sensor directly contacts the unmanageable component in the computing system.

20. The computing system of claim 15, wherein the first and second fan settings define respective duty cycles of the fan in the computing system.

* * * * *

UNITED STATES PATENT AND TRADEMARK OFFICE
CERTIFICATE OF CORRECTION

PATENT NO.        : 9,760,071 B2
APPLICATION NO.   : 14/560916
DATED             : September 12, 2017
INVENTOR(S)       : Sayantan Bhattacharyya et al.

It is certified that error appears in the above-identified patent and that said Letters Patent is hereby corrected as shown below:

In the Specification

In Column 8, Line 24, after "profile" insert -- (i.e., --.

Signed and Sealed this
Twenty-seventh Day of March, 2018

Andrei Iancu
*Director of the United States Patent and Trademark Office*